United States Patent [19] [11] 4,187,201
Hilson et al. [45] Feb. 5, 1980

[54] THICK FILM CONDUCTORS

[75] Inventors: David G. Hilson, Norwalk, Conn.;
Peter A. Tulipan, Irvington, N.Y.

[73] Assignee: Electro Materials Corporation of America, Mamaroneck, N.Y.

[21] Appl. No.: 886,945

[22] Filed: Mar. 15, 1978

[51] Int. Cl.² .............................................. H01B 1/02
[52] U.S. Cl. ................................ 252/512; 252/514;
106/1.13; 106/1.14; 106/1.15; 106/1.29;
428/457
[58] Field of Search ...................... 252/512, 514, 518;
106/1.13, 1.14, 1.15, 1.29

[56] References Cited
U.S. PATENT DOCUMENTS

| 3,385,799 | 5/1968 | Hoffman | 252/514 |
| 3,827,891 | 8/1974 | Larry | 252/514 |
| 3,888,796 | 6/1975 | Nigol | 252/518 |
| 3,923,697 | 12/1975 | Ellis | 252/506 |
| 4,015,230 | 3/1977 | Nitta et al. | 252/518 X |
| 4,051,074 | 9/1977 | Asada | 252/512 X |
| 4,052,641 | 10/1977 | Dominick et al. | 252/518 X |
| 4,072,771 | 2/1978 | Grier, Sr. | 252/512 X |
| 4,090,009 | 5/1978 | Horowitz | 252/514 X |

Primary Examiner—Leland A. Sebastian
Assistant Examiner—E. Suzanne Parr
Attorney, Agent, or Firm—Amster, Rothstein & Engelberg

[57] ABSTRACT

A method of improving the physical characteristics of a conductor paste includes the step of adding ZnO in an amount sufficient to achieve about 1% to 3%, by weight, of the total. Where the conductor paste is adapted to be fired at 850° C., ZnO is added in an amount sufficient to achieve about 2% of the total, and where the conductor paste is adapted to be fired at 985° C., ZnO is added in an amount sufficient to achieve about 3% of the total. Several conductor pastes, based on different conductive metal systems and including ZnO, exhibit unusual and surprisingly beneficial results.

15 Claims, No Drawings

THICK FILM CONDUCTORS

The present invention relates to thick film electrical conductors and the compositions used in formulating the same.

Thick film electrical conductors conventionally comprises a ceramic base to which is bonded a conductive composition formed in a particular pattern. Such conductors are used to couple resistive, dielectric and other circuit elements for use in hybrid circuits and related applications.

Thick film conductors are formed by applying a conductive paste, or ink, to a ceramic base in a particular pattern using conventional screening techniques. The conductor is then fired to a high temperature, resulting in the burning away of a portion of the paste (known as the vehicle) leaving a conductive pattern bonded to the ceramic substrate.

The conductive paste, or ink, may be said to comprise three essential components: the conductive metal; the flux system; and the vehicle. The conductive metal remains in the finished conductor and provides the electrically conductive paths; the vehicle facilitates applying the ink to the substrate; and the flux system essentially provides the characteristics necessary for bonding the conductive metal to the substrate. The present invention particularly relates to the use of new and improved flux systems.

Thick film conductors must be able to form good electrical connections with resistive, dielectric and other circuit elements. These connections must remain in place over the useful life of the circuit. Several tests have been developed to measure parameters to these desirable physical characteristics.

Those skilled in the art understand the importance of initial peel adhesion, which is the measurement of the number of pounds of force required to "peel" the conductive pattern off its substrate immediately after the conductor has been formed. Another important parameter, related to initial adhesion, is aged adhesion. This is a measurement, also in pounds, of the amount of force required to peel the conductive pattern from the substrate; however, this measurement is taken after a period of storage, normally about 1000 hours, after firing at an elevated temperature normally 150° C. and is an important factor in determining whether a particular conductor will be suitable for use in a circuit over the effective life of the circuit.

Another important characteristic of thick film conductors is solder wetting. Solder wetting is a direct measurement, expressed in qualitative terms—excellent, good, etc.—which defines how well a particular conductor receives the solder used to couple it electrically to other elements in the circuit. For example, a conductor is said to exhibit excellent solder wetting characteristics when, after a test emersion in a solder solution, the pattern is completely coated with a smooth, solder film and there is no pile up of solder and no non-wetted or de-wetted areas.

Where it is desirable to use gold as the conductive metal in a thick film conductor, solder wetting is an irrelevant measurement because, as those skilled in the art understand, gold leaches (that is, gold will dissolve into the solder) and accordingly, gold-based conductors are not soldered. The test of coupling characteristics of a gold-based conductor is known as wire bondability, using ultrasonic or thermal-compression bonding. A gold-based conductor is said to exhibit excellent wire bondability when, after bonding a very fine wire to the conductor, the wire adheres to the conductive pattern, and the bond so formed exhibits initial adhesion in excess of about 8 grams.

Those skilled in the art are continually trying to improve the initial adhesion, aged adhesion and solder wetting (or wire bondability) properties of conductive pastes in order to produce higher quality, more useable and longer lasting thick film conductors.

It is also recognized that the firing temperature of a particular conductive paste may present manufacturing difficulties. For reasons which will be discussed below, different applications require different conductive metals, and conventionally pastes using different metals must be fired at different temperatures. This requires either a plurality of firing ovens or the constant modification of temperature in a particular oven. In either case, inefficient plant operation results.

Accordingly, it is an object of the present invention to provide a conductive paste for forming thick film electrical conductor which exhibit improved solder wetting characteristics.

It is a further object of the present invention to form such conductors to exhibit improved initial and aged adhesion characteristics.

It is still a further object of the present invention to form such a paste which may be used in gold-based pastes to exhibit improved wire bondability.

It is still another object of the present invention to produce a paste which will enable conductors to be fired at a constant temperature reasonably irrespective of conductive metal composition.

It has been discovered that the addition of ZnO to standard flux systems, as well as its use in new flux systems designed around it produces surprising and unusual results fulfilling objects of the present invention.

Specifically, it has been discovered that when compared with the best previous results obtainable for a particular conductive metal (e.g. Pd/Ag, Pt/Pd/Au, Cu, Au), the characteristics discussed above are greatly improved. The examples displayed below will exemplify these improved characteristics, and will show the unexpected and surprisingly beneficial results obtained by the use of the present invention.

One conductor paste (shown in Example 1, below) made in accordance with the present invention is a thick film conductor which comprises, by weight: about 16% vehicle; about 70% metal, which metal is made up of Ag and Pd in a ratio of about 3 to 1; and 14% flux, which includes about 2% (of the total paste) ZnO; with the remainder comprising $Bi_2O_3$ and a conventional powdered glass frit in the ratio of about 2 to 1.

The 70%–90% metal content is typical of thick film hybrid conductors, and those skilled in the art understand that to attempt to use a much less metallic system would have detrimetal effects on conductor density and conductivity.

The vehicle can be any one of a number of commercially available organic screening agents, for example, a solvent such as terpineal and a polymer such as ethyl celulose are formed in a mixture, comprising about 10%, by weight, of ethyl celulose and 90%, by weight, terpineal. Those skilled in the art know the various vehicles which can be used in this type of application and the vehicle need not be further explained.

The powdered glass frit is also commercially available, and for example, a lead alumina silicate glass frit of a particle size less than 5 microns would be suitable for this purpose. These skilled in the art also know the types of powdered glass frit which can be used in this type of application, and, accordingly, the glass frit need not be discussed further.

The ZnO is in powdered form of a particle size of less than 5 microns, and it has been found that the manner of introduction of ZnO to the balance of the paste does not materially after the results obtained.

It has been discovered that at 850° C., some beneficial effect in the properties discussed above was evident at a 1% ZnO content, that these properties were optimal at about 2%, and began to fall off when increasing to 3%. In contrast, it was discovered that at 985° C. firing temperature, the best properties were produced at a 3% ZnO content. However, because it is highly desirable to be able to optimize properties in order to allow the thick film conductor to be fired at 850° C. (because this matches the firing profile of most resistive elements used in conjunction with these conductors), it has been determined that the 2% level is preferable for most conductive pastes.

It has also been found that the use of ZnO as described above improves the physical characteristics to a significant degree when used with conductive pastes using other metals. This is a property of great significance because many different conductive metals are used in thick film conductors in order to achieve various desired properties.

Those skilled in the art understand, for example, that the use of Pt increases the leach resistance of Au conductors. Thus, Pt/Au conductors are often used where high reliability is required, for example, in military applications.

Those skilled in the art also understand that Pd is used as an alloy which Ag in order to limit the phenomenon known as Ag migration, in which Ag, in the presence of humidity or a potential gap, tends to migrate across the ceramic substrate from one conductive line to another. Accordingly, Pd/Ag or Pd/Pt/Ag conductors are commonly used.

Similarly, Cu, being inexpensive and not subject to migration, is also used in thick film conductors.

The following examples serve to illustrate the unexpected and surprisingly beneficial results obtained using ZnO in conductor pastes based on various conductive metals.

EXAMPLE 1

A conductor paste made in accordance with the present invention is based on a Pd/Ag conductive metal and comprises, by weight: about 16% vehicle; about 70% metal, which metal is made up of Ag and Pd in a ratio of about 3 and 1; and about 14% flux, which includes about 2% (of the total paste) ZnO, with the remainder comprising $Bi_2O_3$ and a conventional powdered glass frit in the ratio of about 2 to 1.

This new paste was compared with a pre-existing paste which achieved the best adhesion test results for a Pd/Ag-based paste, and which comprised, by weight: about 14% vehicle; about 74% metal, which metal is made up of Ag and Pd in a ratio of about 2 to 1; and about 12% flux, which includes about 3.7% (of the total paste) CdO, about 1.1% (of the total paste) of a $CuO/TiO_2/Al_2O_3$ mixture, with the remainder comprising $Bi_2O_3$ and glass frit in the ratio of about 4 to 7.

The new paste was fired at 850° C. The following results were obtained:

|  | Initial Adhesion (lbs.) | Aged Adhesion (lbs.) | Solder Wetting |
| --- | --- | --- | --- |
| New Paste | >8 | >6 | Good |
| Old Paste | >8 | 3.5–4 | Fair |

EXAMPLE 2

A conductor paste made in accordance with the present invention is based on a Pt/Pd/Au conductive metal and comprises, by weight: about 13% vehicle; about 72% metal, which metal is made up of Pt, Pd and Au in the ratio of about 1 to 1 to 6; with the balance being flux, which includes about 1.7% (of the total paste) ZnO and the remainder $Bi_2O_3$ and glass frit in a ratio slightly greater than 1 to 1.

This new paste was compared with a pre-existing paste which achieved the best test results for a Pt/Pd/Au-based paste, and which comprised, by weight: about 14% vehicle; about 75% metal, which metal is made up of Pt, Pd and Au in the ratio of about 1 to 1 to 6; with the balance being flux, which includes about 1.4% (of the total paste) Cu and the remainder $Bi_2O_3$ and glass frit in the ratio of about 2 to 1.

The new paste was fired at 850° C. The following results were obtained:

|  | Initial Adhesion (lbs.) | Aged Adhesion (lbs.) | Solder Wetting |
| --- | --- | --- | --- |
| New Paste | >10 | >5 | Excellent |
| Old Paste | 5–7 | 2–3 | Fair |

EXAMPLE 3

A conductor paste made in accordance with the present invention is based on a Cu conductive metal and comprises, by weight: about 15% vehicle; about 72% Cu; with the balance being flux, which includes about 2% (of the total) ZnO and the remainder being $Bi_2O_3$ and glass frit in the ratio of about 2 to 1.

This new paste was compared with a pre-existing paste which achieved the best test results for a Cu-based paste, and which comprised, by weight: about 25% vehicle; about 68% Cu; with the balance being 6.3% glass frit.

The new paste was fired at 850° C. The following results were obtained:

|  | Initial Adhesion (lbs.) | Aged Adhesion (lbs.) | Solder Wetting |
| --- | --- | --- | --- |
| New Paste | 5 | N.A. | Good |
| Old Paste | >10 | N.A. | Very Poor |

Note that even though initial adhesion decreased with the use of the new paste, this was more than compensated for by the marked increase in solder wetting.

EXAMPLE 4

A conductor paste made in accordance with the present invention is based on an Au conductive metal and comprises about 7% vehicle; about 85% Au; with the balance being flux, which includes about 1.4% (of the total) ZnO and the remainder being $Bi_2O_3$ and glass in the ratio of about 2 to 1.

This new paste was compared with a pre-existing paste which achieved the best test results for an Au-based paste, and which comprised about 10% vehicle; about 85% Au; with the remainder being flux, which includes about 0.1% (of the total) CuO; about 1.3% (of the total) CdO and the remainder being $Al_2O_3$ and glass frit in the ratio of about 2 to 5.

The new paste was fired at 850° C. The following results were obtained:

|  | Initial Adhesion (lbs.) | Wire Bondability |
| --- | --- | --- |
| New Paste | 5-7 | Excellent |
| Old Paste | 5-8 | Fair |

In examples 1-4, the results given for previous best materials are from samples fired at whatever temperature achieves optimum results. This varies from 850° C. to 985° C.

In addition to the conductor pastes made in accordance with the present invention already discussed, the following pastes also exhibit the unusual and surprising results obtained with the present invention.

In a Pt/Pd/Ag system, a paste comprises, by weight, about 15% vehicle; about 70% metal, which metal is made up of Pt, Pd and Ag in a ratio of about 1 to 5 to 29; and about 15% flux which is made up of about 1.9% (of the total paste) ZnO with the remainder being $Bi_2O_3$ and glass in the ratio of about 2 to 1.

In a Pd/Ag system, a paste comprises, by weight: about 15% vehicle; about 69% metal, which metal is made up of Pd and Ag in a ratio of about 6 to 11; and about 16% flux, which is made up of about 3% (of the total paste) ZnO with the remainder being $Bi_2O_3$ and glass frit in the ratio of about 2 to 1.

In a Pt/Pd/Ag system, a paste comprises, by weight: about 15% vehicle; about 70% metal, which metal is made up of Pt, Pd and Ag in the ratio of about 1 to 3 to 31; and about 15% flux, which includes about 2% (of the total paste) ZnO and the remainder being $Bi_2O_3$ and glass frit in a ratio of about 2 to 1.

In addition to the new flux systems formed around the use of ZnO, it has been found that the use of ZnO in previously existing flux systems has produced extremely beneficial results. This is another unexpected and surprising attribute of the present invention. The following examples show the improved physical characteristics obtained simply by the addition of ZnO to previously existing flux systems.

EXAMPLE 5

A pre-existing conductive paste based on a Pt/Pd/Au conductive metal comprised, by weight: about 14% vehicle, about 75% metal, which metal is made up of Pt, Pd and Au in a ratio of about 1 to 1 to 6; and 11% flux, which includes about 1.4% (of the total paste) CuO with the balance being $Bi_2O_3$ and glass frit in a ratio of about 2 to 1.

ZnO was added to the paste in an amount sufficient to achieve about 2% of the total. The following results were obtained, firing conditions being the same.

|  | Initial Adhesion (lbs.) | Aged Adhesion (lbs.) | Solder Wetting |
| --- | --- | --- | --- |
| With ZnO | 6-7 | unchanged | good |
| Without ZnO | 2-3 | unchanged | good |

EXAMPLE 6

In a Pd/Ag system, a pre-existing paste comprised, by weight: about 12% vehicle; about 75% metal, which metal is made up of Pd and Ag in a ratio of about 13 to 24; and about 13% flux which includes about 1.5% (of the total paste) $CuO/TiO_2/Al_2O_3$ mixture, about 3.7% (of the total paste) CdO with the remainder being $Bi_2O_3$ and glass frit in a ratio of about 1 1.

ZnO was added in an amount sufficient to achieve about 2% (of the total paste), by weight, and the following results were obtained, the firing conditions remaining the same.

|  | Initial Adhesion (lbs.) | Aged Adhesion (lbs.) | Solder Wetting |
| --- | --- | --- | --- |
| With ZnO | 10 | 6-9 | good |
| Without ZnO | 8 | 2-3 | good |

The data compiled herein demonstrates that the use of ZnO either in previously existing conductive pastes or in new conductive pastes designed around the same, can produce improved and beneficial results, and make a commercially superior product than was previously possible.

Although the invention has been described in terms of specific embodiments for illustrative purposes, it will be appreciated by those skilled in the art that many additions, subtractions and modifications are possible without departing from the spirit and scope of the invention as defined in the accompanying claims, and therefore, the same are to be broadly construed.

What is claimed is:

1. A conductor paste comprising: a conductive metal consisting essentially of one member of the group consisting of Cu, Au, Au combined with Pt and Pd, Ag combined with Pd, and Ag combined with Pd and Pt; a vehicle; and a flux, said flux including ZnO in an amount equal to about 1% to 3% by weight of the total.

2. A conductor paste adapted to be fired at 850° C., said conductor paste comprising: a conductive metal consisting essentially of one member of the group consisting of Cu, Au, Au combined with Pt and Pd, Ag combined with Pd, and Ag combined with Pd and Pt; a vehicle; and a flux, said flux including ZnO in an amount equal to about 2%, by weight, of the total.

3. A conductor paste adapted to be fired at 985° C., said conductor paste comprising: a conductive metal consisting essentially of one member of the group consisting of Cu, Au, Au combined with Pt and Pd, Ag combined with Pd, and Ag combined with Pd and Pt; a vehicle; and a flux, said flux including ZnO in an amount equal to about 3%, by weight, of the total.

4. An electrical conductor formed by depositing the conductor paste of claim 1 or claim 2 or claim 3 onto a substrate, and firing said conductor paste at a temperature sufficient to burn off the vehicle included in such conductor paste, and leave a conductive pattern bonded to said substrate.

5. A conductor paste comprising, by weight: about 70% metal, said metal being composed of Ag and Pd in the ratio of about 3 to 1; about 16% vehicle; and about 14% flux, said flux being composed of about 2% of the total paste ZnO, and $Bi_2O_3$ and powdered glass frit in the ratio of about 2 to 1.

6. A conductor paste comprising, by weight: about 72% metal, said metal being composed of Pt, Pd and Au in the ratio of about 1 to 1 to 6; about 13% vehicle; and about 15% flux, said flux being composed of about 1.7% of the total paste ZnO, and $Bi_2O_3$ and powdered glass frit in the ratio of slightly greater than 1 to 1.

7. A conductor paste comprising, by weight: about 72% Cu; about 15% vehicle; and about 13% flux, said flux composed of about 2% of the total paste ZnO, and $Bi_2O_3$ and powdered glass frit in the ratio of about 2 to 1.

8. A conductor paste comprising, by weight: about 85% Au; about 7% vehicle; and about 8% flux, said flux being composed of about 1.4% of the total paste ZnO, and $Bi_2O_3$ and powdered glass frit in the ratio of about 2 to 1.

9. A conductor paste comprising, by weight: about 70% metal, said metal being composed of Pt, Pd and Ag in the ratio of about 1 to 5 to 29; about 15% vehicle; and about 15% flux, said flux being composed of about 1.9% of the total paste ZnO, and $Bi_2O_3$ and powdered glass frit in the ratio of about 2 to 1.

10. A conductor paste comprising, by weight: about 69% metal, said metal being composed of Pd and Ag in the ratio of about 6 to 11; about 15% vehicle, and about 16% flux, said flux being composed of about 3% of the total paste ZnO, and $Bi_2O_3$ and powdered glass frit in the ratio of about 2 to 1.

11. A conductor paste comprising, by weight: about 70% metal, said metal being composed of Pt, Pd and Ag in the ratio of about 1 to 3 to 31; about 15% vehicle; and about 15% flux, said flux being composed of about 2% of the total paste ZnO, and $Bi_2O_3$ and powdered glass frit in the ratio of about 2 to 1.

12. In a conductor paste comprising, by weight: about 75% metal, said metal being composed of Pt, Pd and Au in the ratio of about 1 to 1 to 6; about 14% vehicle; and about 11% flux, said flux being composed of about 1.4% of the total paste CuO, and $Bi_2O_3$ and powdered glass frit in a ratio of about 2 to 1, the improvement comprising the step of adding ZnO in an amount sufficient to achieve about 2% of the total paste.

13. In a conductor paste comprising, by weight: about 75% metal, said metal being composed of Pd and Ag in a ratio of about 13 to 24; about 12% vehicle; and about 13% flux, said flux being composed of about 1.5% of the total paste $CuO/TiO_2/Al_2O_3$ mixture, about 3.7% of the total paste CdO and $Bi_2O_3$ and powdered glass frit in the ratio of about 1 to 1, the improvement comprising the step of adding ZnO in an amount sufficient to achieve about 2% of the total paste.

14. An electrical conductor formed by depositing the conductor paste of claim 5 or claim 6 or claim 7 or claim 8 or claim 9 or claim 10 onto a substrate, firing said conductor paste at a temperature sufficient to burn off said vehicle and leave a conductive pattern bonded to said substrate.

15. An electrical conductor formed by depositing the improved conductor paste of claim 12 or claim 13 onto a substrate, firing said conductor paste at a temperature sufficient to burn off said vehicle and leave a conductive pattern bonded to said vehicle.

* * * * *